US009728659B2

(12) United States Patent
Hirigoyen et al.

(10) Patent No.: US 9,728,659 B2
(45) Date of Patent: Aug. 8, 2017

(54) SPAD DEVICE WITH RADIATION BLOCKING RINGS AND VIAS AND RELATED ARRAYS AND METHODS

(71) Applicants: STMICROELECTRONICS (RESEARCH & DEVELOPMENT) LIMITED, Marlow Bucks (GB); STMICROELECTRONICS (GRENOBLE 2) SAS, Grenoble (FR)

(72) Inventors: Flavien Hirigoyen, Grenoble (FR); Bruce Rae, Edinburgh (GB); Gaelle Palmigiani, Autrans (FR); Stuart McLeod, Edinburgh (GB)

(73) Assignees: STMICROELECTRONICS (RESEARCH & DEVELOPMENT) LIMITED, Marlow Bucks (GB); STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 14/870,108

(22) Filed: Sep. 30, 2015

(65) Prior Publication Data

US 2016/0064579 A1 Mar. 3, 2016

Related U.S. Application Data

(63) Continuation-in-part of application No. PCT/GB2014/051895, filed on Jun. 20, 2014.

(30) Foreign Application Priority Data

Jun. 21, 2014 (GB) .................................. 1311055.6

(51) Int. Cl.
*H01L 31/107* (2006.01)
*H01L 27/144* (2006.01)
(Continued)

(52) U.S. Cl.
CPC ...... *H01L 31/02327* (2013.01); *G01J 1/4228* (2013.01); *G01J 1/44* (2013.01);
(Continued)

(58) Field of Classification Search
CPC ......... H01L 27/14623; H01L 27/14636; H01L 27/14609; H01L 27/14643; H01L 27/14603; H01L 27/14625
See application file for complete search history.

(56) References Cited

U.S. PATENT DOCUMENTS

| 4,078,243 A | 3/1978 | De Bar et al. |
| 2003/0160250 A1* | 8/2003 | Cova ................ H01L 27/14643 257/80 |

(Continued)

FOREIGN PATENT DOCUMENTS

| EP | 1679749 A1 | 7/2006 |
| EP | 1840967 A1 | 10/2007 |

(Continued)

OTHER PUBLICATIONS

Rochas et al., Single Photon Detector Fabricated in a Complementary Metal-Oxide-Semiconductor High-Voltage Technology, Review of Scientific Instruments, vol. 74, No. 7, Jul. 2003, pp. 3263-3270.

(Continued)

*Primary Examiner* — Victor A Mandala
*Assistant Examiner* — Regan J Rundio
(74) *Attorney, Agent, or Firm* — Slater Matsil, LLP

(57) ABSTRACT

A Single-Photon Avalanche Diode (SPAD) device an active region configured to detect incident radiation, a first radiation blocking ring surrounding the active region, and a radiation blocking cover configured to shield part of the active region from the incident radiation. The radiation blocking cover is configured to define a second radiation (Continued)

blocking ring vertically spaced apart from the first radiation blocking ring. The SPAD device may include radiation blocking vias extending between the first and second radiation blocking rings.

18 Claims, 10 Drawing Sheets

(51) Int. Cl.
| | |
|---|---|
| H01L 27/146 | (2006.01) |
| H01L 31/18 | (2006.01) |
| H01L 31/0232 | (2014.01) |
| H01L 31/0224 | (2006.01) |
| G01J 1/44 | (2006.01) |
| G01T 1/24 | (2006.01) |
| H01L 31/02 | (2006.01) |
| H01L 31/0216 | (2014.01) |
| G01J 1/42 | (2006.01) |
| H01L 27/148 | (2006.01) |

(52) U.S. Cl.
CPC .......... *G01T 1/248* (2013.01); *H01L 27/1443* (2013.01); *H01L 27/1446* (2013.01); *H01L 27/1461* (2013.01); *H01L 27/14603* (2013.01); *H01L 27/14609* (2013.01); *H01L 27/14623* (2013.01); *H01L 27/14625* (2013.01); *H01L 27/14636* (2013.01); *H01L 27/14643* (2013.01); *H01L 31/02027* (2013.01); *H01L 31/02164* (2013.01); *H01L 31/107* (2013.01); *H01L 31/18* (2013.01); *H01L 27/14818* (2013.01)

(56) References Cited

U.S. PATENT DOCUMENTS

| | | | |
|---|---|---|---|
| 2004/0132262 A1* | 7/2004 | Ayabe | H01L 27/14623 438/428 |
| 2005/0258349 A1 | 11/2005 | Matsuyama et al. | |
| 2008/0075474 A1 | 3/2008 | Kawai | |
| 2008/0237769 A1* | 10/2008 | Okihara | H01L 27/14623 257/435 |
| 2011/0169117 A1 | 7/2011 | McIntosh et al. | |
| 2014/0104474 A1* | 4/2014 | Tange | H01L 27/14627 348/308 |
| 2015/0293021 A1* | 10/2015 | Finkelstein | G01N 21/6452 506/13 |

FOREIGN PATENT DOCUMENTS

| | | |
|---|---|---|
| EP | 2040308 A1 | 3/2009 |
| JP | 63-058977 | 3/1988 |
| JP | 2010056173 A | 3/2010 |

OTHER PUBLICATIONS

Stuart McLeod, U.S. Appl. No. 14/781,333, filed Sep. 30, 2015.

\* cited by examiner

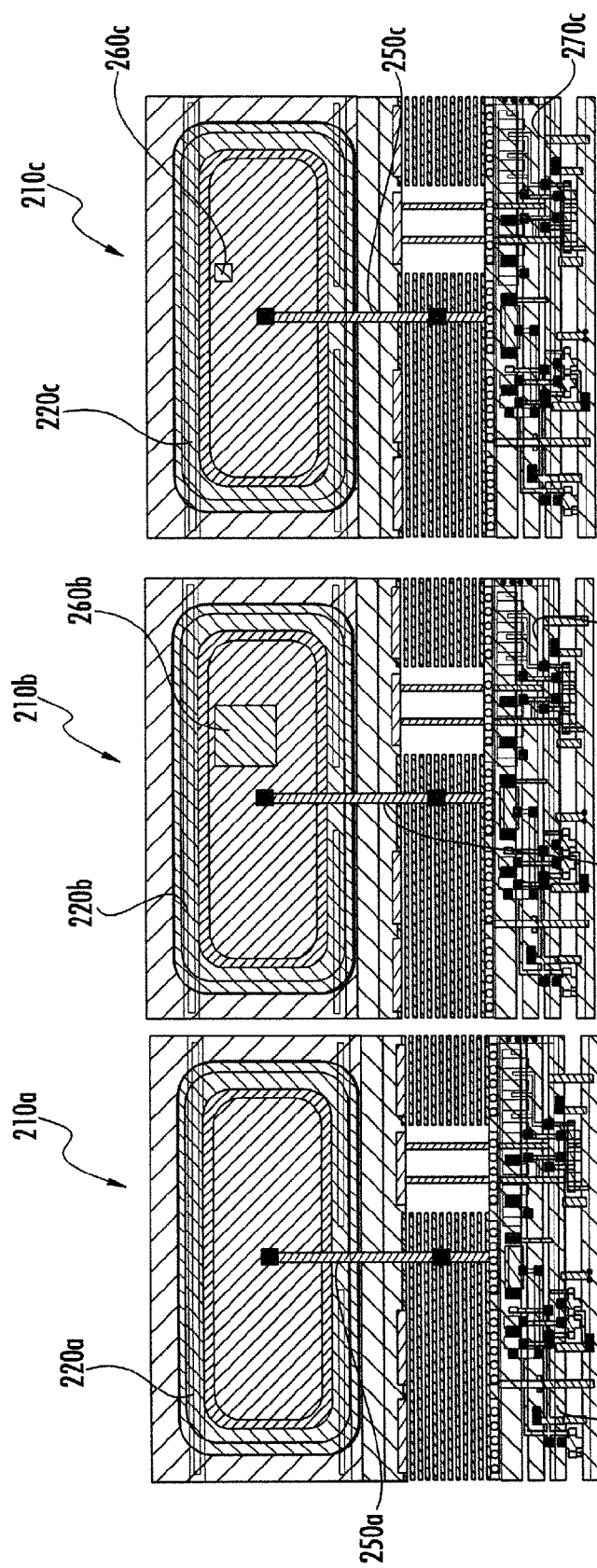

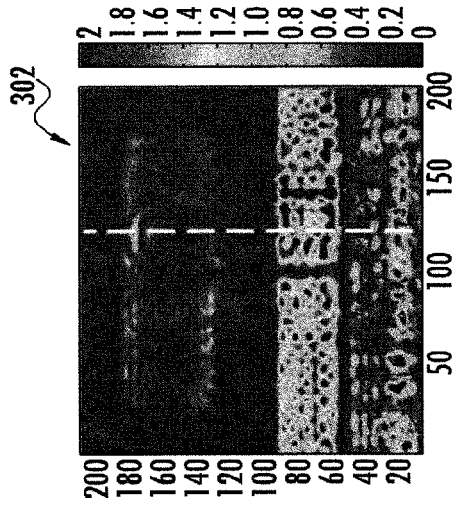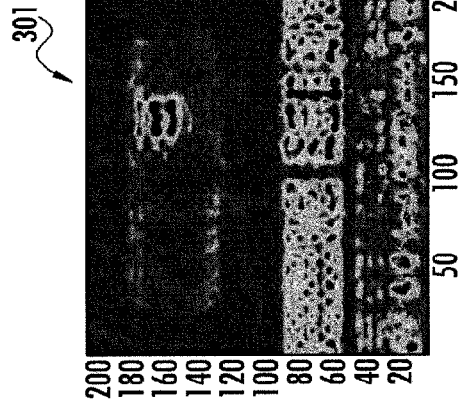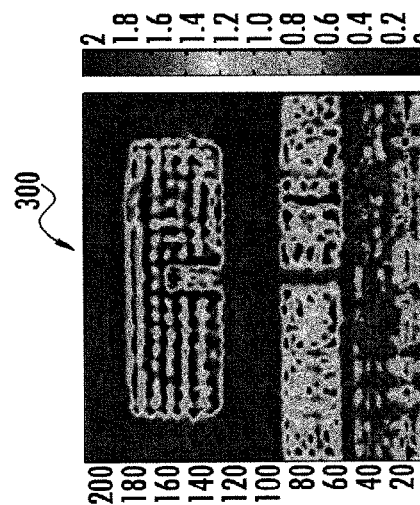
FIG. 7A  FIG. 7B  FIG. 7C
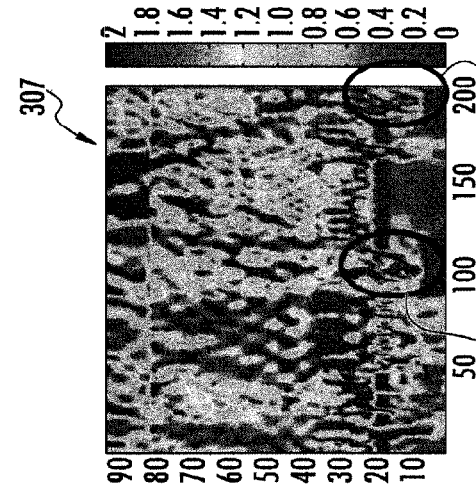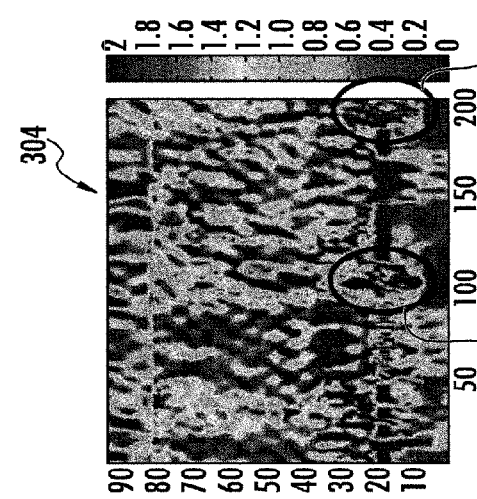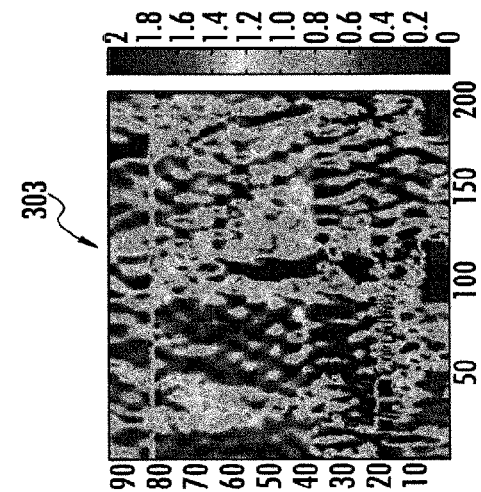
FIG. 8A  FIG. 8B  FIG. 8C

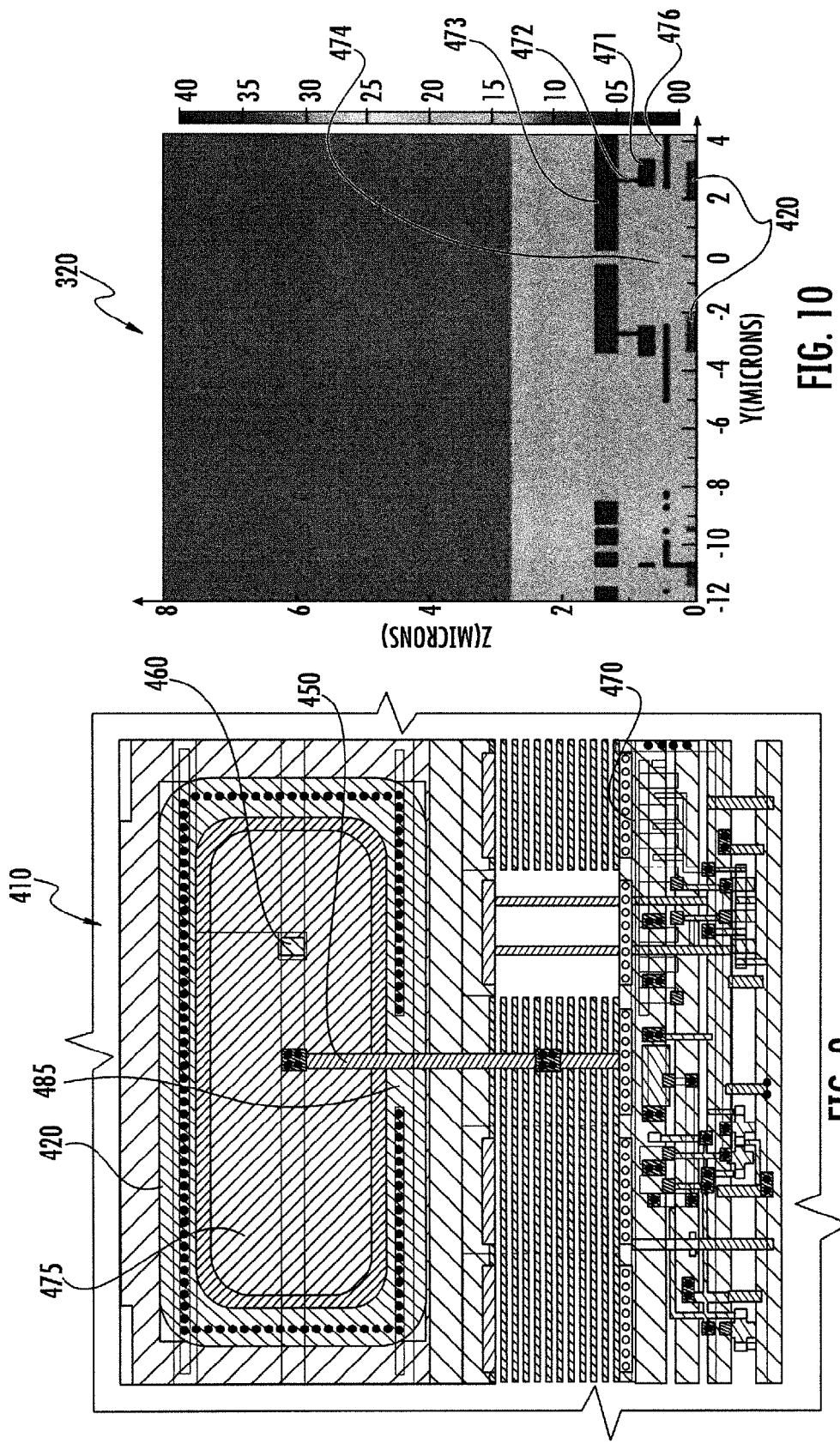

SPAD DEVICE WITH RADIATION BLOCKING RINGS AND VIAS AND RELATED ARRAYS AND METHODS

RELATED APPLICATION

This application is based upon prior filed Application No. PCT/GB2014/051895, filed Jun. 20, 2014, the entire subject matter of which is incorporated herein by reference in its entirety.

TECHNICAL FIELD

This application relates to Single-Photon Avalanche Diodes (SPADs), and, in particular to, SPADs usable in ambient light sensing and ranging applications.

BACKGROUND

A SPAD is based on a p-n junction device biased beyond its breakdown region. The high reverse bias voltage generates a sufficient magnitude of electric field such that a single charge carrier introduced into the depletion layer of the device can cause a self-sustaining avalanche via impact ionization. The avalanche is quenched, either actively or passively to allow the device to be "reset" to detect further photons. The initiating charge carrier can be photo-electrically generated by way of a single incident photon striking the high field region. It is this feature which gives rise to the name "Single Photon Avalanche Diode". This single photon detection mode of operation is often referred to as "Geiger Mode".

Single photon counting devices output response to incident light intensity becomes significantly non-linear as intensity increases. This may be problematic for many applications, such as ambient light sensing and ranging. It may be desirable to provide a SPAD and/or SPAD array with a better linear output response to illumination levels.

SUMMARY

Generally speaking, a SPAD device may include an active region configured to detect incident radiation, a first radiation blocking ring surrounding the active region, and a radiation blocking cover configured to shield part of the active region from the incident radiation. The radiation blocking cover is configured to define a second radiation blocking ring vertically spaced apart from the first radiation blocking ring. The SPAD device may include a plurality of radiation blocking vias extending between the first and second radiation blocking rings. Advantageously, the radiation blocking rings and vias may reduce noise from adjacent diodes.

More specifically, the second radiation blocking ring may be above the first radiation blocking ring. The first radiation blocking ring may be aligned vertically with the second radiation blocking ring. The first radiation blocking ring may have a gap therein, and the SPAD device may further comprise an anode electrically conductive layer extending through the gap.

In some embodiments, the SPAD device may further include electrical connections coupled to the anode electrically conductive layer, and the radiation blocking cover may comprise a same material as the anode electrically conductive layer and the electrical connections.

Also, the second radiation blocking ring may be continuous. The radiation blocking cover may be configured to shield greater than or equal to 40% of the active region, or shield greater than or equal to 75% of the active region. In some embodiments, the radiation blocking cover, the plurality of radiation blocking vias, and the first and second radiation blocking rings each comprises a metallic material.

Another aspect is directed to an array of SPADs. The array may include a plurality of SPADs arranged in rows and columns. Each SPAD may include an active region configured to detect incident radiation, a first radiation blocking ring surrounding the active region, and a radiation blocking cover configured to shield part of the active region from the incident radiation. The radiation blocking cover is configured to define a second radiation blocking ring vertically spaced apart from the first radiation blocking ring. The SPAD device may include a plurality of radiation blocking vias extending between the first and second radiation blocking rings.

Yet another aspect is directed to a method for making a SPAD device. The method may include forming an active region to detect incident radiation, and forming a first radiation blocking ring surrounding the active region. The method may include forming a radiation blocking cover to shield part of the active region from the incident radiation and to define a second radiation blocking ring vertically spaced apart from the first radiation blocking ring, and forming a plurality of radiation blocking vias extending between the first and second radiation blocking rings.

BRIEF DESCRIPTION OF THE DRAWINGS

FIGS. 6A-6C show schematic top plan views of SPADs, each SPAD having a different attenuation profile, according to the present disclosure.

FIGS. 7A-7C show a top plan view of electromagnetic field distribution at the silicon interface of the SPADs of FIGS. 6A-6C, respectively, during operation.

FIGS. 8A-8C show a cross-section view of electromagnetic field distribution of the SPADs of FIGS. 6A-6C, respectively, during operation.

FIG. 9 shows a schematic top plan view of another embodiment of the SPAD, according to the present disclosure.

FIG. 10 shows a side view of the stack of the SPAD of FIG. 9.

DETAILED DESCRIPTION

Figure 1:
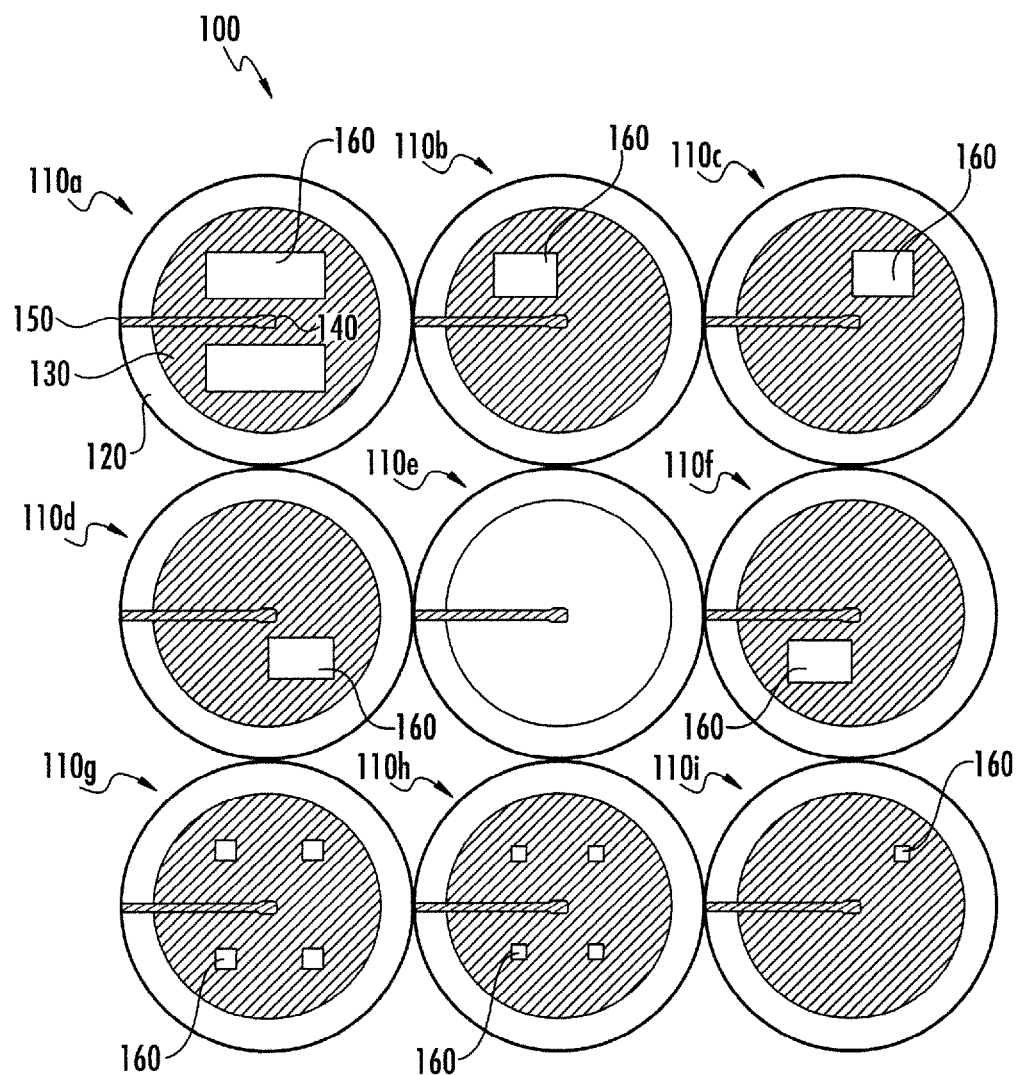
FIG. 1 shows a schematic top plan view of an array of SPADs, each SPAD having a different attenuation profile, according to the present disclosure.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

An avalanche is triggered when reverse biasing a PN-junction to around the breakdown voltage. This effect can be used in two modes of operation. Commonly, the avalanche photodiodes are biased just below the breakdown voltage, the photocurrent remaining proportional to the incoming light intensity. Gain values of a few hundred are obtained in III-V semiconductors as well as in silicon.

SPADs are solid-state photo detectors which utilize the fact that p-n diodes can be stable for a finite time above their breakdown voltage. When an incident photon with sufficient energy to liberate an electron arrives, avalanche multiplication of the photo-generated electron occurs due to the high electric field. This produces a measurable current pulse signaling the arrival of the photon which negates the need for amplification due to the internal gain of the device.

Essentially SPADs are photodiodes that are biased above the breakdown voltage in the so-called Geiger mode. This mode of operation requires the introduction of a quenching mechanism to stop the avalanche process. Each incoming photon results in a strong current pulse of few nanoseconds duration. The device works as an optical Geiger counter.

Quenching is required to stop the avalanche process, which is done by reducing the SPAD's reverse bias below its breakdown voltage. The simplest quenching circuit is commonly referred to as passive quenching. Usually, passive quenching is simply performed by providing a resistance in series to the SPAD. The avalanche current self-quenches simply because it develops a voltage drop across the resistance (a high-value ballast load), reducing the voltage across the SPAD to below its breakdown voltage. After the quenching of the avalanche current, the SPAD's bias slowly recovers to at or above the breakdown voltage and the detector is ready to be triggered again.

An alternative to passive quenching is active quenching. There are a number of different active quenching arrangements, although in general active quenching refers to detection of a breakdown event by some subsequent digital logic connected to the SPAD output, and actively pulling the SPAD moving node to a voltage below breakdown, quenching the avalanche. Active quenching is desirable for several reasons, including a reduction in dead time, and improved photon counting rate at high light levels enabling a dynamic range extension. Active quenching is essential in many applications of SPAD technology.

Dead time is the time interval after detection of a photon, during which it is quenched and returned to its active state. During this time, no photons are detected by the SPAD. While actively quenching the SPAD will bring it to its active state more quickly after a detection event than with passive quenching, under high light levels (with many detection events), the SPAD can still spend a large fraction of its time inactive. This can lead to saturation and reduction in the number of photons detected by the SPAD. The result of this is that the SPAD output does not track the light level linearly, which causes problems in some applications. By the nature of their design, SPADs have no gain control mechanism to address this problem. It is proposed therefore, to attenuate the SPAD to improve output linearity.

FIG. 1 shows a SPAD array 100 coupled to logic circuitry (not shown). Shown are nine SPADs 110a-110i. Each SPAD comprises a guard ring region 120, a breakdown region 130, an anode 140, and a track area 150 for connection to the anode. Only photons incident on the breakdown region are detected. The breakdown region is shielded by the anode and the track area reducing its active area. Taking one specific, non-limiting, example, the SPAD may have an effective active area of 48.05 $\mu m^2$.

Attenuation may be achieved by further reducing the SPAD's active area. This may be done by covering more of the breakdown region with a non-transmissive cover, which acts to block any photons incident on the cover surface. One way of doing this is to cover part of the breakdown region with a metal layer when forming the metal track and anode. The metal layer may completely cover the active area, except for one or more apertures 160. In this way, the only photons detected by the SPAD are those which pass through the aperture and onto the SPAD's active area.

In FIG. 1, one SPAD 110e is shown uncovered as is conventional. The remaining SPADs are shown with their active areas covered, the covers having various aperture 160 configurations, thereby providing varying degrees of attenuation. The cover of SPAD 110a has two apertures 160 providing 1/1.73 area attenuation. SPADs 110b, 110c, 110d, 110f, 110g all have covers with aperture 160 arrangements providing 1/7.3 attenuation. SPADs 110b, 110c, 110d, 110f all have a single aperture located in a different quadrant of the active area of the SPAD, while SPAD 110g has four apertures that are each quarter of the size than that of SPADs 110b, 110c, 110d, 110f. SPAD 110h has four apertures, each of which provides an attenuation of 1/117, thereby providing a total attenuation of 1/29.3. SPAD 110i has only one aperture, which provides an attenuation of 1/117. This particular SPAD array arrangement is shown to illustrate the effect of different attenuation levels.

The effect of the attenuation is to reduce the number of photons detected by the SPAD. In doing this, the SPAD does not need to be reset so often, and therefore the likelihood is reduced, of a photon arriving during a SPAD reset following a previous detection event. Consequently, fewer photons are missed by the SPAD, and linearity is maintained at higher incident light levels. This results in a more linear output response to light intensity.

Figure 2A:
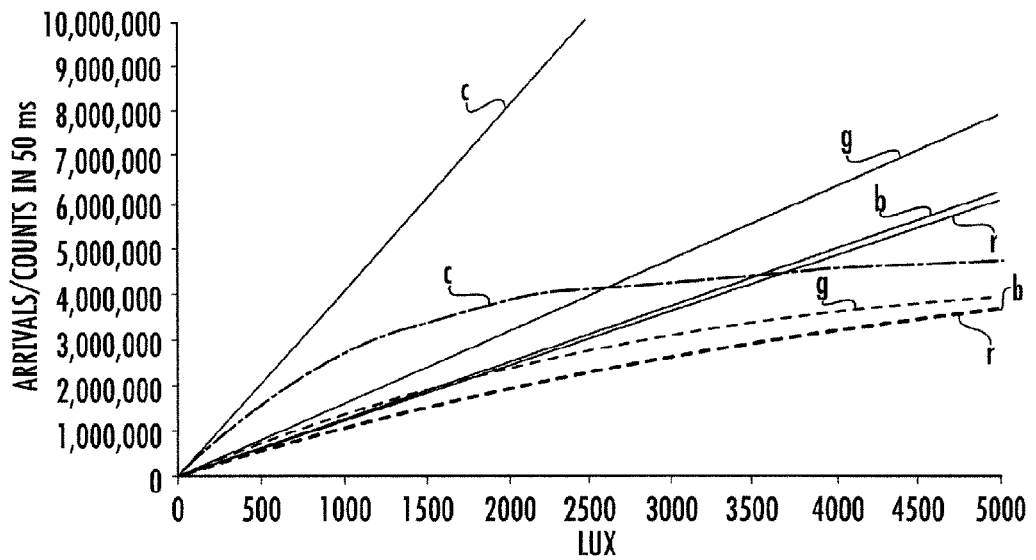
FIG. 2a is a diagram of the number of photon arrivals in 50 ms (solid lines) and the number of photon counts recorded in 50 ms (dashed lines), against light intensity for unfiltered SPADs, and for SPADs having red, green and blue filters with no attenuation, according to the present disclosure.

FIG. 2a is a plot of the number of photon arrivals in 50 ms (solid lines) and the number of photon counts recorded in 50 ms (dashed lines), against light intensity for clear c, red r, green g and blue b SPADs with no attenuation. The counts are given for a 50 ms worst case for flicker immunity. The plot shown is for 6500K CCT illumination. The plot shows significant non-linearity with a large number of missed photons even at 500 lux for the clear SPAD. Green, red and blue are all significantly affected above 1000 lux. In this example clear SPADs have no optical filter, whereas red, green and blue SPADs have optical filters which pass red, green and blue light respectively. Attenuation resultant from the optical filters is discounted when describing a SPAD as having no attenuation.

Figure 2B:
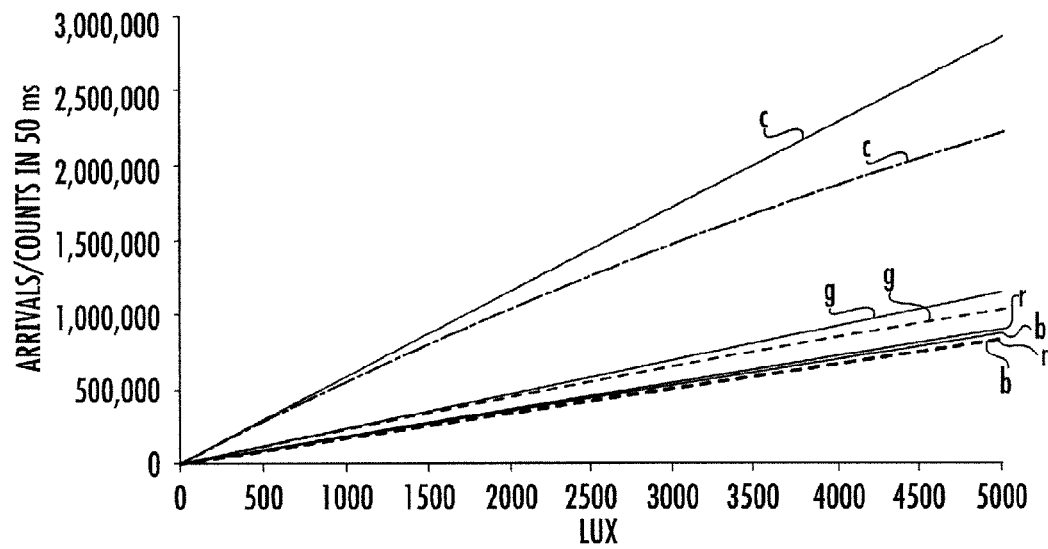
FIG. 2b is a diagram of the number of photon arrivals in 50 ms (solid lines) and the number of photon counts recorded in 50 ms (dashed lines), against light intensity for unfiltered SPADs, and for SPADs having red, green and blue filters with 1/1.73x attenuation, according to the present disclosure.
Figure 2C:
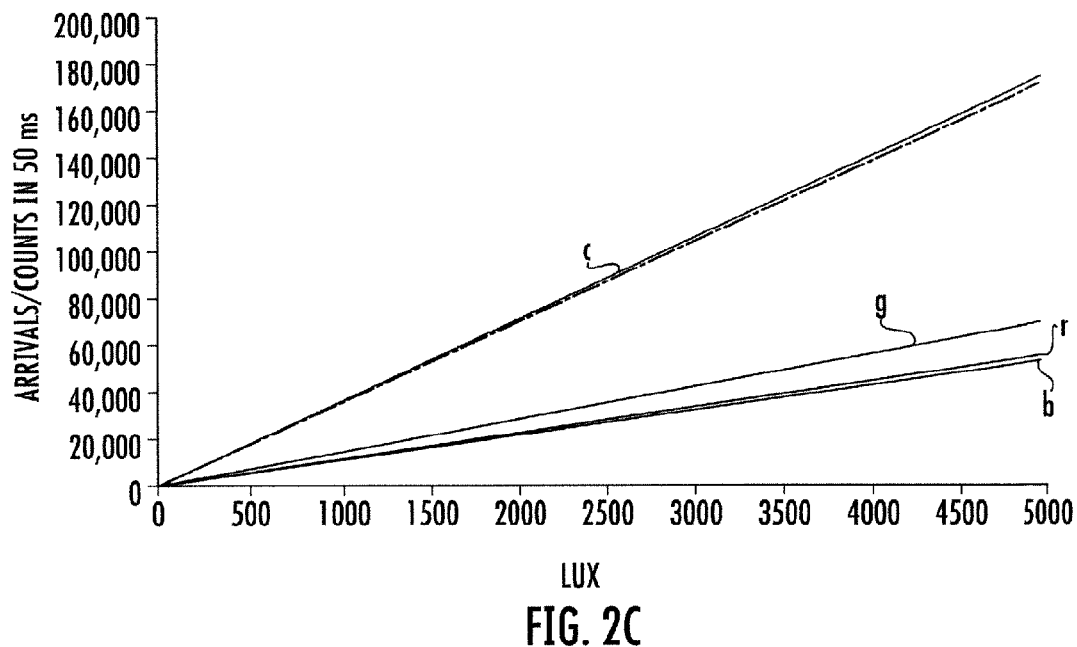
FIG. 2c is a diagram of the number of photon arrivals in 50 ms (solid lines) and the number of photon counts recorded in 50 ms (dashed lines), against light intensity for unfiltered SPADs, and for SPADs having red, green and blue filters with 1/117x attenuation, according to the present disclosure.

FIG. 2b shows a similar graph to that of FIG. 2a, but for SPADs having covers providing 1/1.73x attenuation. It shows significantly reduced non-linearity compared to SPADs having no attenuation. The output is essentially linear up to 1000 lux for clear SPADs and up to 2500 lux for red/green/blue SPADs. FIG. 2c shows that same graph for 1/117x attenuated SPADs. Non-linearity is greatly reduced for all channels in this case, with the plots for photon arrivals and photon counts largely overlapping, illustrating a linear response.

Figure 3A:
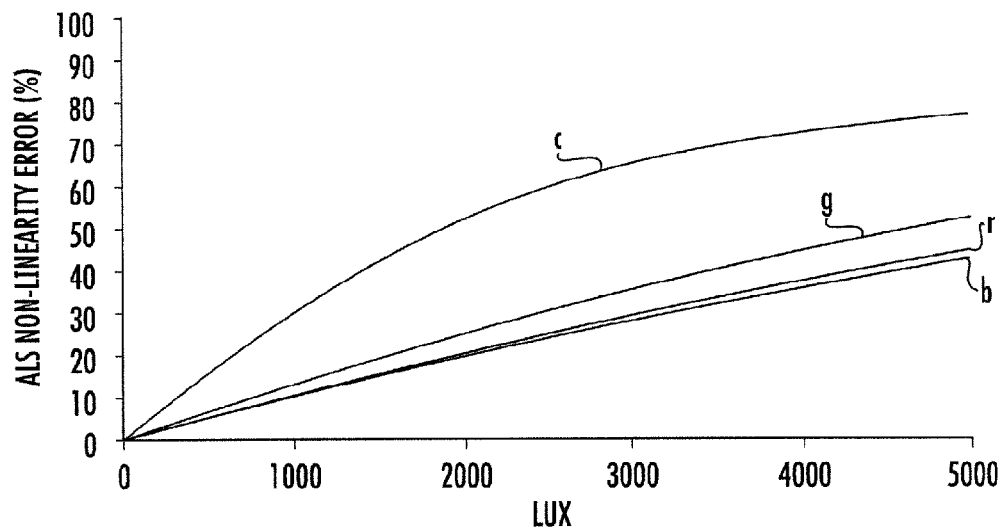
FIG. 3a is a diagram of the non-linearity error against light intensity for unfiltered SPADs, and for SPADs having red, green and blue filters with no attenuation, according to the present disclosure.
Figure 3B:
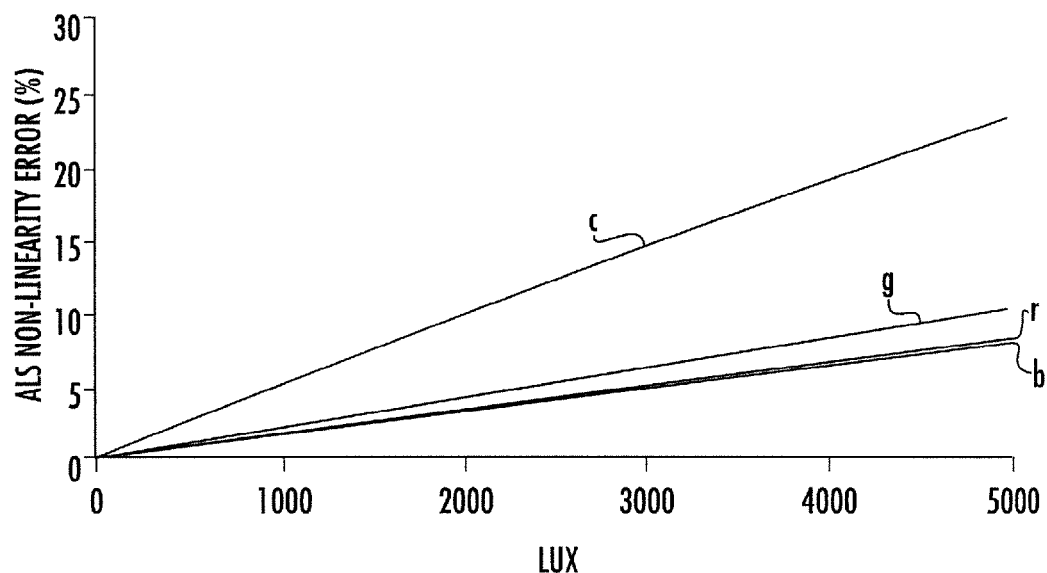
FIG. 3b is a diagram of the non-linearity error against light intensity for unfiltered SPADs, and for SPADs having red, green and blue filters with 1/1.73x attenuation, according to the present disclosure.
Figure 3C:
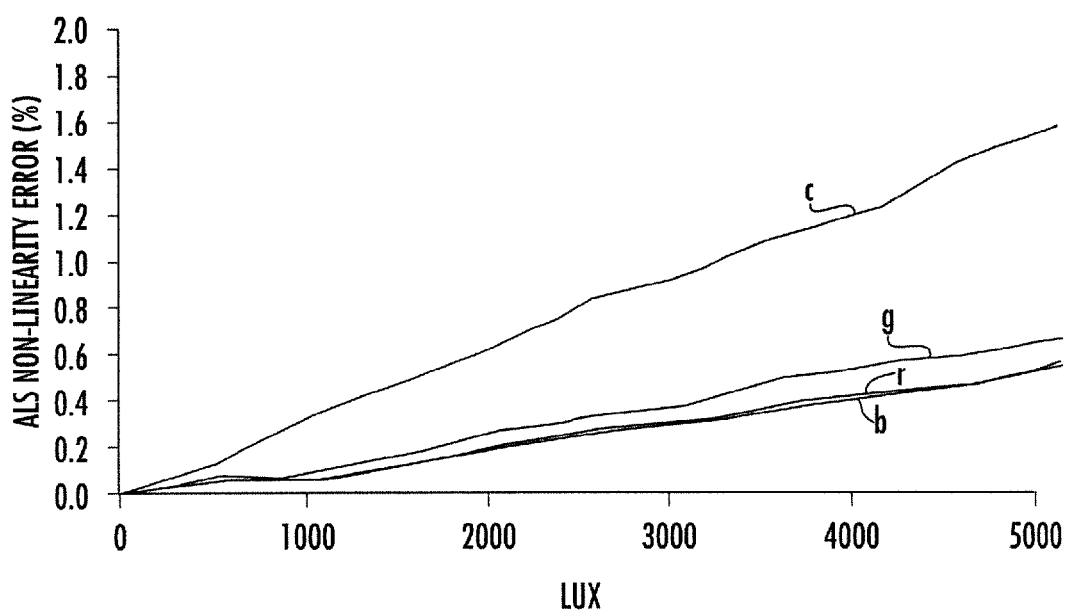
FIG. 3c is a diagram of the non-linearity error against light intensity for unfiltered SPADs, and for SPADs having red, green and blue filters with 1/117x attenuation, according to the present disclosure.
Figure 4:
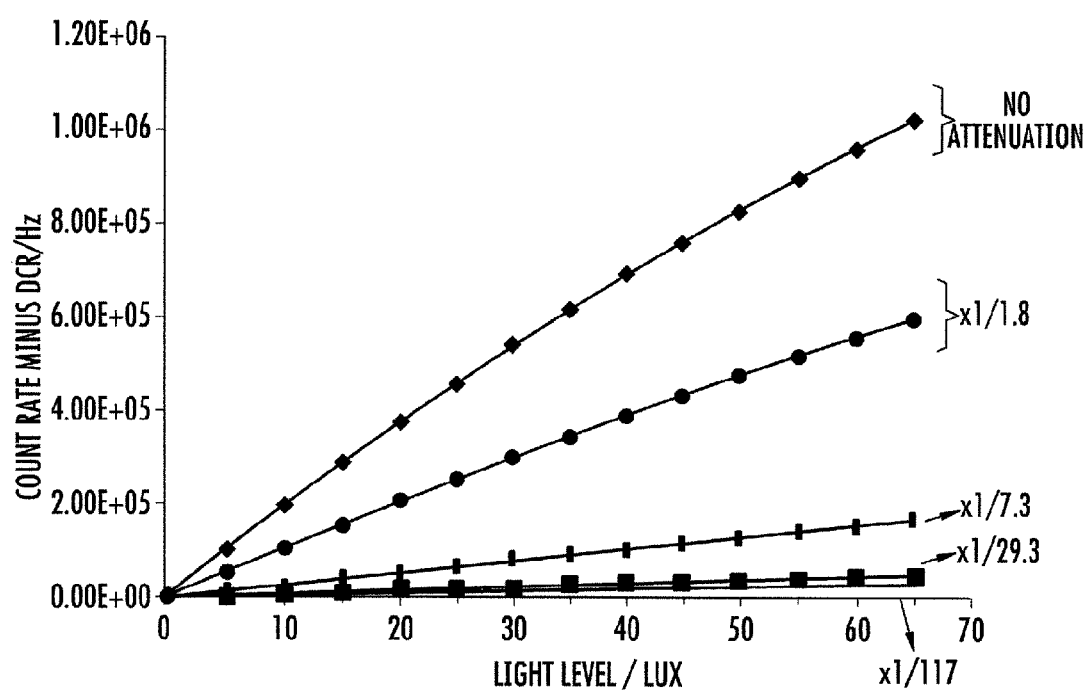
FIG. 4 is a diagram of count rate (minus dark rate count) against light intensity for SPADs attenuated with varying aperture sizes, according to the present disclosure.

FIGS. 3a-3c show a plot of the non-linearity error against light intensity for clear c, red r, green g and blue b SPADs, with no attenuation, 1/1.73x attenuation, and 1/117x attenuation respectively. It can be seen that 1/117x attenuation results in a non-linearity error of less than 1% (up to 5 klux) for red, green and blue SPADs; and a non-linearity error of less than 2% (up to 5 klux) for clear SPADs. FIG. 4 shows a graph of count rate (corrected for the darkcount rate) against light intensity for SPADs attenuated with varying aperture sizes. It can be seen that the area aperture attenuations match actual area reductions.

In practical applications, the SPADs disclosed herein will be arranged in arrays. The attenuation levels chosen for particular arrays of SPADs will depend on the specific application, the likely illumination conditions and the acceptable level of non-linearity. For example, if the SPAD array is always likely to be used in situations where illumination levels are high, then an array of SPADs all having high attenuation (such as 1/117x attenuation) may be suitable. However, if illumination levels then fall, the detection rate may fall close to zero.

Consequently, for many practical applications, an array of SPADs with different attenuation levels may be advantageous. This allows an acceptably linear output to be achievable in a wide range of light conditions. In one embodiment, an array may comprise banks of SPADs, one or more having no attenuation, one or more having lesser attenuation (for example 1/1.73x attenuation) and one or more having greater attenuation (for example 1/117x attenuation). In very low light levels (less than 500 lux as illustrated in FIG. 2a), the un-attenuated SPADs will provide a suitably linear response. At medium light levels, the output from the 1/1.73x attenuated SPADs should be selected. At the highest light levels, the outputs of the 1/117x attenuated SPADs should be selected.

Suitable logic may be provided to select the appropriate SPAD outputs depending on illumination conditions. There are a number of different ways such logic may be implemented. For example, the outputs of particular banks (having particular attenuation levels) may be selected if their count rate is measured to be over a certain lower threshold level, or between upper and lower threshold levels.

In other embodiments, the specific levels of attenuation may be varied from those illustrated. SPADs according to the concepts described herein may have, depending on the embodiment, over 40%, over 50%, over 75%, over 85%, over 95% or over 99% of the active area covered/shielded. Arrays may comprise any combination of such SPADs.

Referring now additionally to FIGS. 5-9C, another embodiment of the array of SPADs 200 and applications thereof are now described. In these figures, those elements already discussed above with respect to FIG. 1 are incremented by 200 and most require no further discussion herein.

Figure 5:
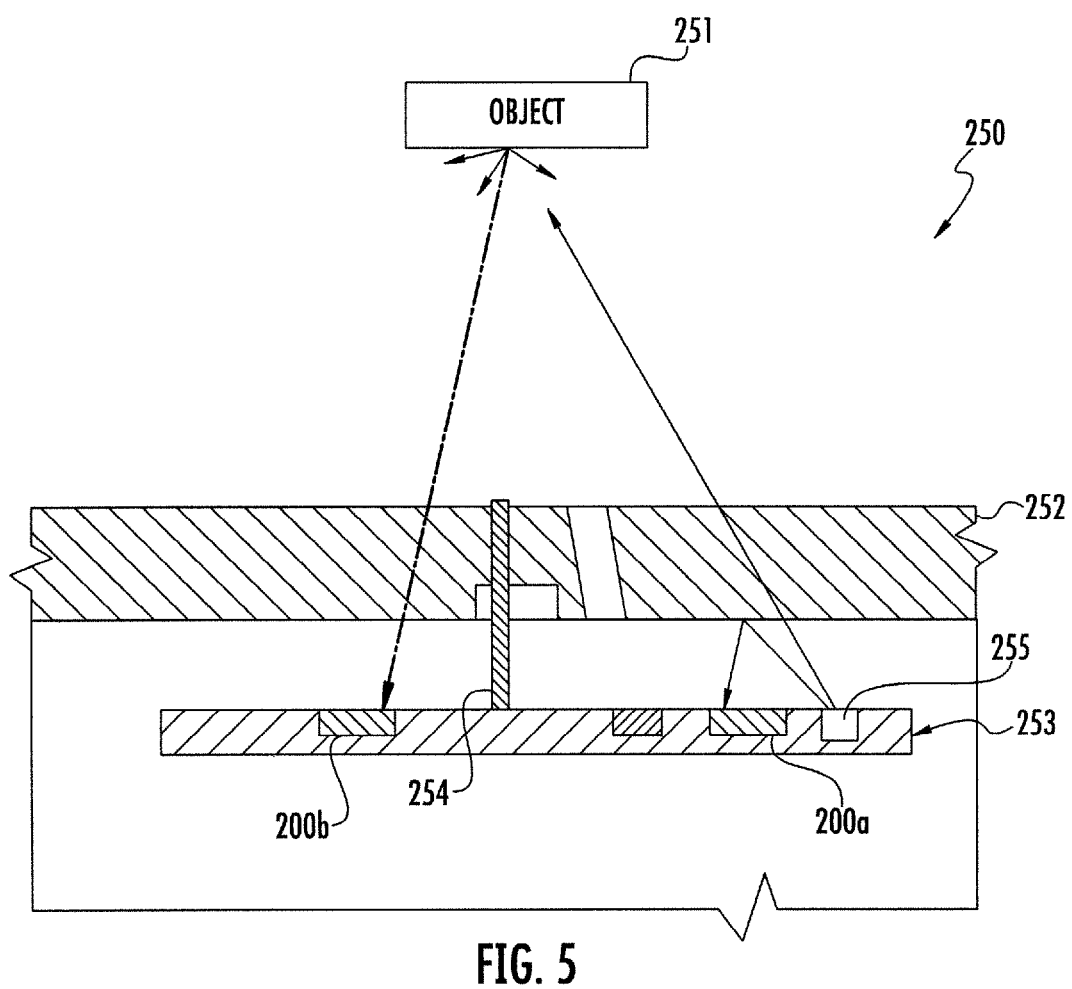
FIG. 5 is schematic diagram of a ranging device, according to the present disclosure.
Figure 12:
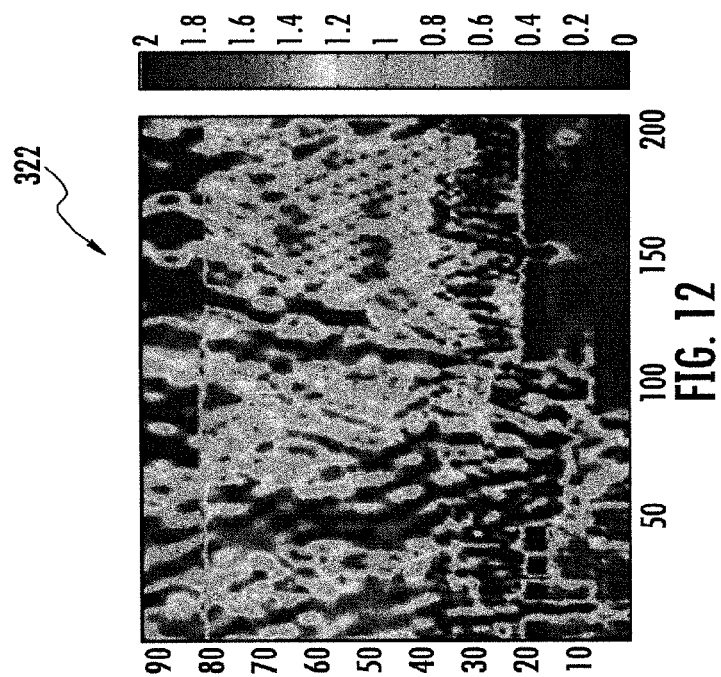
FIGS. 11 and 12 are respective top plan and cross-section of the electromagnetic field distribution of the SPAD of FIG. 9 during operation.
Figure 11:
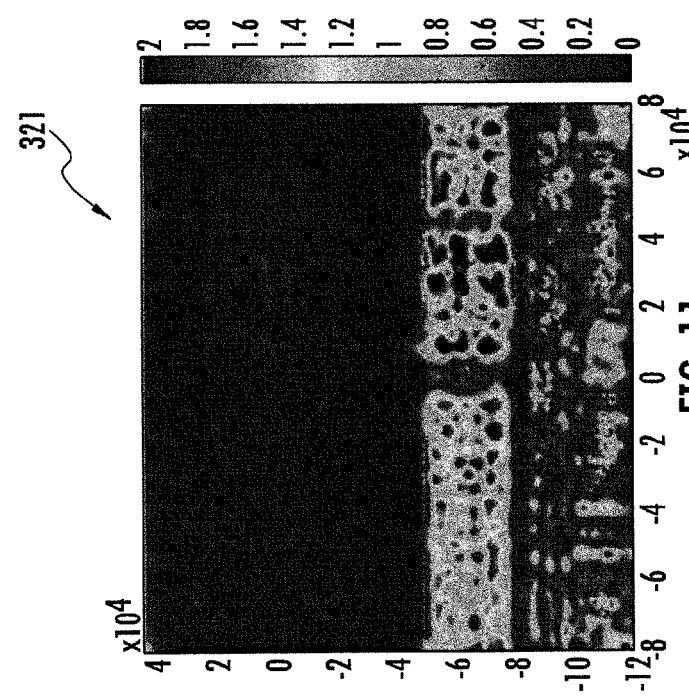

Referring now to FIGS. 5-6C, a ranging device 256 is now described. The ranging device 256 is configured to detect a range to an object 251, and comprises a housing 252, and a circuit board 253 carried by the housing. The circuit board 253 illustratively includes a light source (e.g. an infrared (IR) vertical-cavity surface-emitting laser) 255 configured to irradiate the object 251 with radiation (e.g. IR radiation) through an opening (not shown) in the housing 252. The circuit board 253 illustratively includes a reference array of SPADs 200a configured to detect radiation purposefully reflected from internal portions of the housing 252, and a return array of SPADs 200b configured to detect reflected radiation from the object 251 and through another opening in the housing. The ranging device 256 also illustratively includes a divider 254 for preventing internal reflections from the light source 255 from impinging the return array of SPADs 200b.

As will be appreciated, the ranging device 256 includes processing circuitry that uses an output of the reference array of SPADs 200a to more accurately process an output of return array of SPADs 200b (e.g. gain and calibration adjustments), and to synchronize time-of-flight measurements. In some embodiments, the ranging device 256 may offload this step to a host device.

The reference array of SPADs 200a illustratively includes a plurality of SPADs 210a-210c. The first SPAD 210a includes no aperture, i.e. full 100% exposure of the active region; the second SPAD 210b includes a 10% attenuating aperture 260b; and the third SPAD 210c includes a 1% attenuating aperture 260c. Each SPAD 210a-210c illustratively includes readout circuitry 270a-270c, and a guard ring region 220a-220c.

Referring now to FIGS. 7A-8C, electromagnetic distribution diagrams 300-304, 307 demonstrate the SPADs 210a-210c during test IR illumination. In particular, as can be seen, there is substantial optical cross-talk (see call outs 305-306, 308-309) between the SPADs and their adjacent diodes. During the testing of the ranging device 256, the output of the plurality of SPADs 210a-210c in the reference array of SPADs 200a was not in line with expected attenuation due to the covers. Indeed, during testing, the second SPAD 210b produced a 22% return (rather than an expected 10% return), and the third SPAD 210c produced a 10% return (rather than an expected 1% return). This excess in return intensity is due to optical cross-talk between adjacent SPADs in the reference array of SPADs 200a. This optical cross-talk is the result of reflection between metallization layers M3 and M1 within the reference array of SPADs 200a. As will be appreciated, the reference array of SPADs 200a includes three metallization levels, M1-M3. The uppermost metallization layer is M3, and the active metallization layer is the lowest, i.e. M1. In some embodiments, a fourth uppermost metallization layer M4 can be added to improve flexibility of the shielding.

Referring now additionally to FIGS. 9-12, another embodiment of the SPAD device 410 and applications thereof are now described. In these figures, those elements already discussed above with respect to FIGS. 1 and 6A-6C are incremented by 400 and most require no further discussion herein.

In FIGS. 9-10, a SPAD device 410 illustratively includes an active region 474 configured to detect incident radiation, a first radiation blocking ring 471 surrounding the active region, and a radiation blocking cover 473 configured to shield part of the active region from the incident radiation. The radiation blocking cover 473 is configured to define a second radiation blocking ring vertically spaced apart from the first radiation blocking ring 471. The SPAD device 410 illustratively includes a plurality of radiation blocking vias 472 extending between the first and second radiation blocking rings 471, 473. The first radiation blocking ring 471 is formed in the M2 metallization layer, and second radiation blocking ring 473 is formed in the M3 metallization layer, which also defines the radiation blocking cover 473. The radiation blocking cover 473 is configured to shield part of the active region 474 from the incident radiation and defines an aperture 460 therein. The SPAD device 410 illustratively includes polysilicon ring 420 surrounding the active region 474. In some embodiments, the plurality of radiation blocking vias 472 may be near continuous or continuous, i.e. forming a vertical wall/trench surrounding and laterally shielding the active region 474.

More specifically, the second radiation blocking ring 473 is illustratively above the first radiation blocking ring 471 (with the front end detecting side facing up). As perhaps best seen in the stack description 320 of FIG. 10, the first radiation blocking ring 471 is aligned vertically with the second radiation blocking ring 473. Also, the first and second radiation blocking rings 471, 473, and the plurality of radiation blocking vias 472 are dummy metallization layers, i.e. they are not connected to active circuitry. The SPAD device 410 illustratively includes a lowermost M1 metallization layer 476.

The first radiation blocking ring 471 has a gap 485 therein, and the SPAD device 410 comprises an anode electrically conductive layer 450 extending through the gap. Also, the second radiation blocking ring 473 is illustratively continuous, but may contain gaps in some embodiments.

The SPAD device 410 illustratively includes electrical connections 470 (e.g. readout circuitry) coupled to the anode electrically conductive layer 450. Also, the radiation blocking cover 473 may comprise a same material as the anode electrically conductive layer 450 and the electrical connections 470.

Yet another aspect is directed to a method for making a SPAD device 410. The method may include forming an active region 474 to detect incident radiation, and forming a first radiation blocking ring 471 surrounding the active region. The method may include forming a radiation blocking cover 473 to shield part of the active region 474 from the incident radiation and to define a second radiation blocking ring 473 vertically spaced apart from the first radiation blocking ring 471, and forming a plurality of radiation blocking vias 472 extending between the first and second radiation blocking rings. Advantageously, the first and second (the second ring being defined by the radiation blocking cover) radiation blocking rings 471, 473, and the plurality of radiation blocking vias 472 reduce optical cross-talk between adjacent SPADs in an array. Indeed, as shown in the electromagnetic distribution diagrams 321, 322, the optical leakage from the SPAD device 410 has been reduced.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A Single-Photon Avalanche Diode (SPAD) array comprising:
   a first SPAD and other adjacent SPADs, the first SPAD comprising:
     a first active region configured to detect incident radiation;
     a first radiation blocking ring surrounding and above the first active region;
     a first radiation blocking cover extending directly over at least a portion of the first active region and configured to:
       shield a first area of the first active region from the incident radiation, and
       a plurality of radiation blocking vias extending between said first and second radiation blocking rings; and
     said first radiation blocking cover extending over and inwardly past said plurality of radiation blocking vias, and;
   wherein each of the other adjacent SPADs comprise second active regions and associated second radiation blocking covers shielding second areas of the second active regions; wherein the size of the first area of the first active region is different from the sizes of each of the second areas of the second active regions shielded in the other adjacent SPADs.

2. The SPAD array of claim 1 wherein said first radiation blocking ring is aligned vertically with said second radiation blocking ring.

3. The SPAD array of claim 1 wherein said first radiation blocking ring has a gap therein; and further comprising an anode electrically conductive layer extending through the gap.

4. The SPAD array of claim 3 further comprising electrical connections coupled to said anode electrically conductive layer; and wherein said first radiation blocking cover comprises a same material as said anode electrically conductive layer and said electric connections.

5. The SPAD array of claim 1 wherein said second radiation blocking ring is continuous.

6. The SPAD array of claim 1 wherein the size of the first area is 40% the size of the first active region.

7. The SPAD array of claim 1 wherein the size of the first area is 75% the size of the first active region.

8. The SPAD array of claim 1 wherein said first radiation blocking cover, said plurality of radiation blocking vias, and said first and second radiation blocking rings each comprises a metallic material.

9. An array of Single-Photon Avalanche Diodes (SPADs), the array of SPADs comprising:
   a plurality of SPADs arranged in rows and columns, each SPAD of the plurality of SPADs comprising:
     an active region configured to detect incident radiation
     a first radiation blocking ring surrounding and above said active region a radiation blocking cover extending directly over at least a portion of said active region and configured to:
- shield an area of said active region from the incident radiation, and
- define a second radiation blocking ring vertically spaced apart from and above said first radiation blocking ring; and a plurality of radiation blocking vias extending between said first and second radiation blocking rings, said radiation blocking cover extending over and inwardly past said plurality of radiation blocking vias, wherein the size of the area of the active region in one SPAD of the plurality of SPADs is different from the size of the area of the active region of an adjacent SPAD of the plurality of SPADs.

10. The array of SPADs of claim 9 wherein said first radiation blocking ring is aligned vertically with said second radiation blocking ring.

11. The array of SPADs of claim 9 wherein said first radiation blocking ring has a gap therein; and further comprising an anode electrically conductive layer extending through the gap.

12. The array of SPADs of claim 11 wherein each SPAD of the plurality of SPADs further comprises electrical connections coupled to said anode electrically conductive layer; and wherein said radiation blocking cover comprises a same material as said anode electrically conductive layer and said electrical connections.

13. The array of SPADs of claim 9 wherein said second radiation blocking ring is continuous.

14. The array of SPADs of claim 9 wherein said plurality of radiation blocking vias are configured to block radiation from the other adjacent SPADs.

15. A method for making a Single-Photon Avalanche Diode (SPAD) device in an array of SPADs, the method comprising:

forming a first active region to detect incident radiation;

forming a first radiation blocking ring surrounding and above the first active region;

forming a first radiation blocking cover extending directly over at least a portion of the first active region and configured to:
- shield a first area of the first active region from the incident radiation, and
- define a second radiation blocking ring vertically spaced apart from and above the first radiation blocking ring; and forming a plurality of radiation blocking vias extending between the first and second radiation blocking rings, the first radiation blocking cover extending over and inwardly past the plurality of radiation blocking vias; and forming other adjacent SPADs of the array of SPADs by forming second active regions and associated second radiation blocking covers shielding second areas of the second active regions, wherein the size of the first area of the first active region is different from the sizes of each of the second areas of the second active regions shielded in the other adjacent SPADs.

16. The method of claim 15 wherein the first radiation blocking ring is aligned vertically with the second radiation blocking ring.

17. The method of claim 15 wherein the first radiation blocking ring has a gap therein; and further comprising forming an anode electrically conductive layer extending through the gap.

18. The method of claim 17 further comprising forming electrical connections coupled to the anode electrically conductive layer; and wherein the first radiation blocking cover comprises a same material as the anode electrically conductive layer and the electrical connections.

* * * * *

UNITED STATES PATENT AND TRADEMARK OFFICE
CERTIFICATE OF CORRECTION

PATENT NO. : 9,728,659 B2  
APPLICATION NO. : 14/870108  
DATED : August 8, 2017  
INVENTOR(S) : Flavien Hirigoyen Page 1 of 1

It is certified that error appears in the above-identified patent and that said Letters Patent is hereby corrected as shown below:

In the Claims

In Column 9, Line 13-14, Claim 9, delete "wherein the size of the area of the active region in one SPAD" and insert --wherein the size of the area of the active region that is shielded in one SPAD--.

In Column 9, Line 15-16, Claim 9, delete "from the size of the area of the active region of an adjacent SPAD of the plurality of SPADS" and insert --from the size of the area of the active region that is shielded in an adjacent SPAD of the plurality of SPADS--.

Signed and Sealed this  
First Day of September, 2020

Andrei Iancu  
*Director of the United States Patent and Trademark Office*